US005724722A

United States Patent [19]

Hashimoto

[11] Patent Number: 5,724,722

[45] Date of Patent: Mar. 10, 1998

[54] PART STATE DETECTING DEVICE FOR MOUNTER

[75] Inventor: Kazuhisa Hashimoto, Iwata, Japan

[73] Assignee: Yamaha Matsudoki Kabushiki Kaisha, Iwata, Japan

[21] Appl. No.: 593,496

[22] Filed: Jan. 30, 1996

[30] Foreign Application Priority Data

Feb. 2, 1995 [JP] Japan .................................... 7-016180

[51] Int. Cl.$^6$ .............................. H05K 3/30; H05K 13/04

[52] U.S. Cl. ................................ 29/740; 29/721; 29/741; 29/743; 29/833; 294/64.1; 414/737; 414/752; 901/40; 901/47

[58] Field of Search .............................. 29/720, 721, 740, 29/741, 743, 833, DIG. 44; 294/64.1, 2; 414/737, 752; 901/40, 47

[56] References Cited

U.S. PATENT DOCUMENTS

| | | | |
|---|---|---|---|
| 5,224,262 | 7/1993 | Takaichi et al. | 29/721 |
| 5,377,405 | 1/1995 | Sakurai et al. | 29/833 |

FOREIGN PATENT DOCUMENTS

| | | | |
|---|---|---|---|
| 0596533 | 5/1994 | European Pat. Off. | 29/740 |
| 0597447 | 5/1994 | European Pat. Off. | 29/740 |

*Primary Examiner*—Peter Vo

*Attorney, Agent, or Firm*—Knobbe, Martens, Olson & Bear LLP

[57] ABSTRACT

A component handling device that is adapted to provide determination of a component picked up by a pickup device by different recognition methods depending upon the size of the component picked up. One recognition method employs a light source and a receptor and is carried by the mounting head. The other device includes a fixed camera and the light source is carried either by the mounting head and/or fixed relative to the camera.

12 Claims, 5 Drawing Sheets

PART STATE DETECTING DEVICE FOR MOUNTER

BACKGROUND OF THE INVENTION

This invention relates to a component mounting device and more particularly to an improved arrangement for determining the actual orientation of components picked up by a mounter head to assist in their accurate placement.

There is a large variety of equipment available for picking up components from a storage area and positioning them in an accurate location on a substrate. This type of apparatus is frequently utilized for what are referred to as "surface mounters." These surface mounters deal with electrical components and pick up any of a variety of components from feeder stations and place them on a board for mounting thereon.

Obviously, it is very important to ensure that the components are accurately positioned on the substrate. The manner in which the components are picked up is such that the component will not be accurately aligned relative to the pick-up device when it is initially picked up.

Frequently, these components are presented at the feeder stations in feeder tapes. These tapes have a series of apertures in which small components are located. The pick-up device selects the component from the aperture and then positions it on the substrate. Because the aperture in which the component is located must be large enough to permit the component to be easily withdrawn, the component is not in an accurate location when picked up.

Therefore, devices have been proposed wherein the component's location may be sensed relative to the pick-up device after it has been picked up. From this information, the actual mounting position of the component can be corrected in the X, Y and rotational axes so as to ensure the accurate placement of the component.

There have been proposed two general types of sensing devices which are utilized to sense the position of the component relative to the mounting head which holds it. The first of this general type employs a methodology whereby the component is positioned in a sensing area between an emitter and a receptor. By manipulating or locating the component in this manner, it is possible to obtain data from which the corrective factors can be calculated.

This type of device has some advantages, in that it can be mounted easily on the mounting head along with the pick-up device so that the sensing operation can take place when the component is being moved from its pick-up position to its deposit position. Therefore, this type of device is useful in facilitating the speed of operation.

There is, however, a defect with this type of device, which generally is an optical detector wherein the emitter emits light rays and the receptor receives a shadow cast by the component. Because of this method of operation, the distance between the emitter and the receptor should be kept relatively small so as to improve the accuracy. Therefore, this type of device is used with relatively minute components.

Another type of detector utilizes a photographic type of detection wherein the actual image of the component is received, and from this image, it is possible to determine the corrective factors. This type of device can be utilized with larger components, since the distance between the receptor and the component can vary widely without adverse affects on the readings. However, the device normally uses an electronic camera, and these cameras are generally too large to be mounted on the mounting head. In addition, they generally look at the article in a plane perpendicular to that used in the emitter receptor type of system. Therefore, the camera must be placed in the line in which the component will be moved for its final placement, thus making mounting on the mounting head difficult.

In order to be as versatile as possible and to permit high production rates, a single mounting apparatus should, therefore, be able to handle a wide variety of components. However, from the foregoing description, it should be readily apparent that if a wide variety of components are to be positioned, then two different sensing methods may be required. It is desirable, if the apparatus can be capable, of using the two different sensing methods without compromising the sensing ability of each type of device.

It is, therefore, a principal object of this invention to provide an improved mounting device that is capable of handling a wide variety of components.

It is a further object of this invention to provide an improved sensing arrangement for a mounting device wherein a wide variety of types of components can be measured and corrected factors generated for them.

It is a further object of this invention to provide an improved mounting device that can embody both an optical and photographic type of sensing, depending upon the type of component to be handled.

SUMMARY OF THE INVENTION

This invention is adapted to be embodied in a component handling device for accurately placing components of a wide variety of types and sizes. The handling device includes a mounting head and an operational device for the mounting head for moving the mounting head between a plurality of positions. A first sensing station is carried by the mounting head and comprises an emitter and a receptor spaced by a gap for forming a sensing area. A second sensing station is provided which is spaced from the first sensing station and is adapted to provide a different type of sensing for the components than that provided in the first sensing station. A component pick-up device is provided which is capable of holding and releasing components. A support supports the component pick-up device for movement with the mounting head upon operation of the operational device and for movement relative to the mounting head for selectively positioning the component held thereby in the sensing area for sensing the condition thereof or in another position for sensing in the second sensing station.

DETAILED DESCRIPTION OF THE PREFERRED EMBODIMENT OF THE INVENTION

Figure 1:
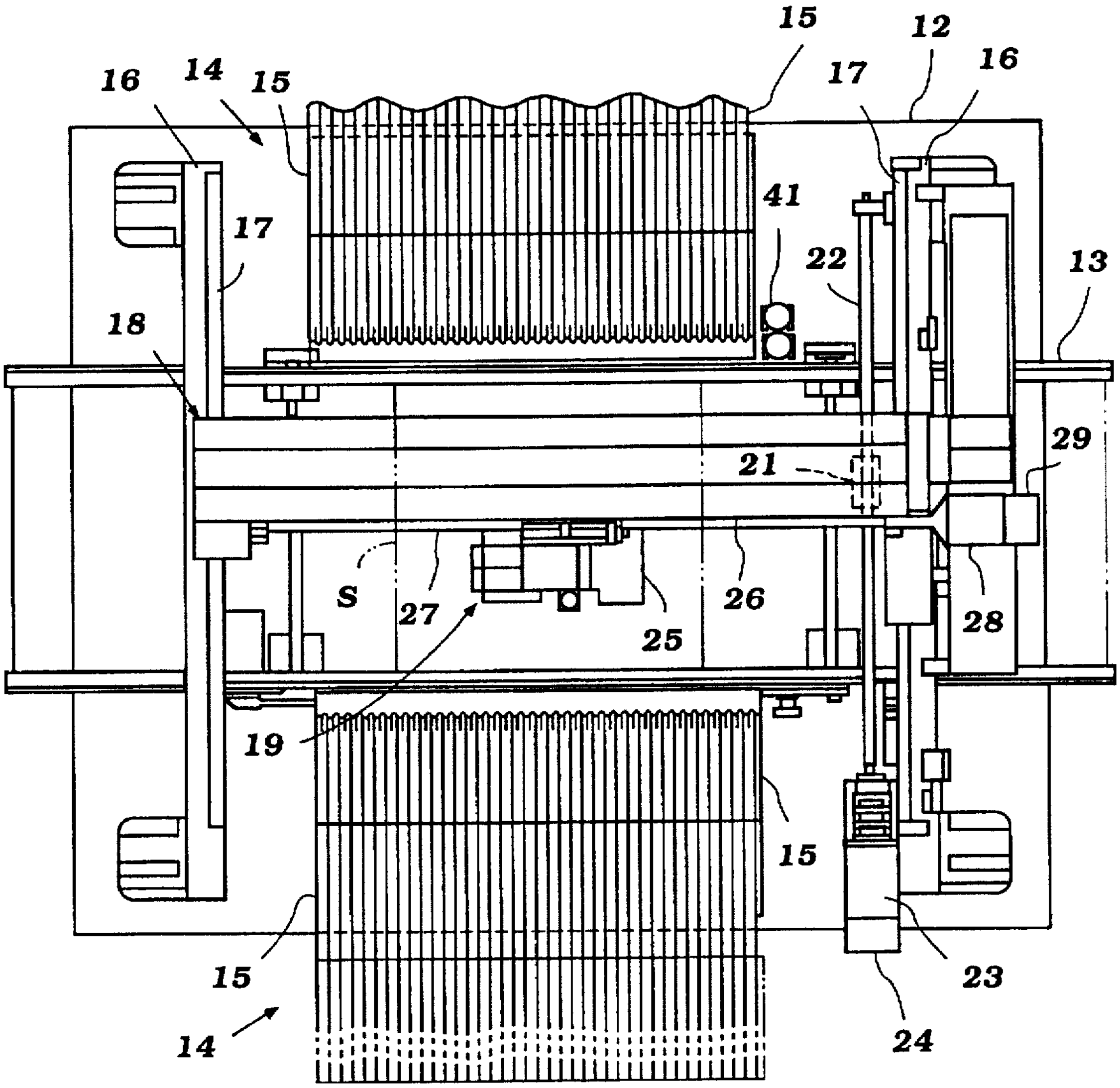
FIG. 1 is a top plan view showing a component mounting apparatus constructed and operated in accordance with an embodiment of the invention.
Figure 2:
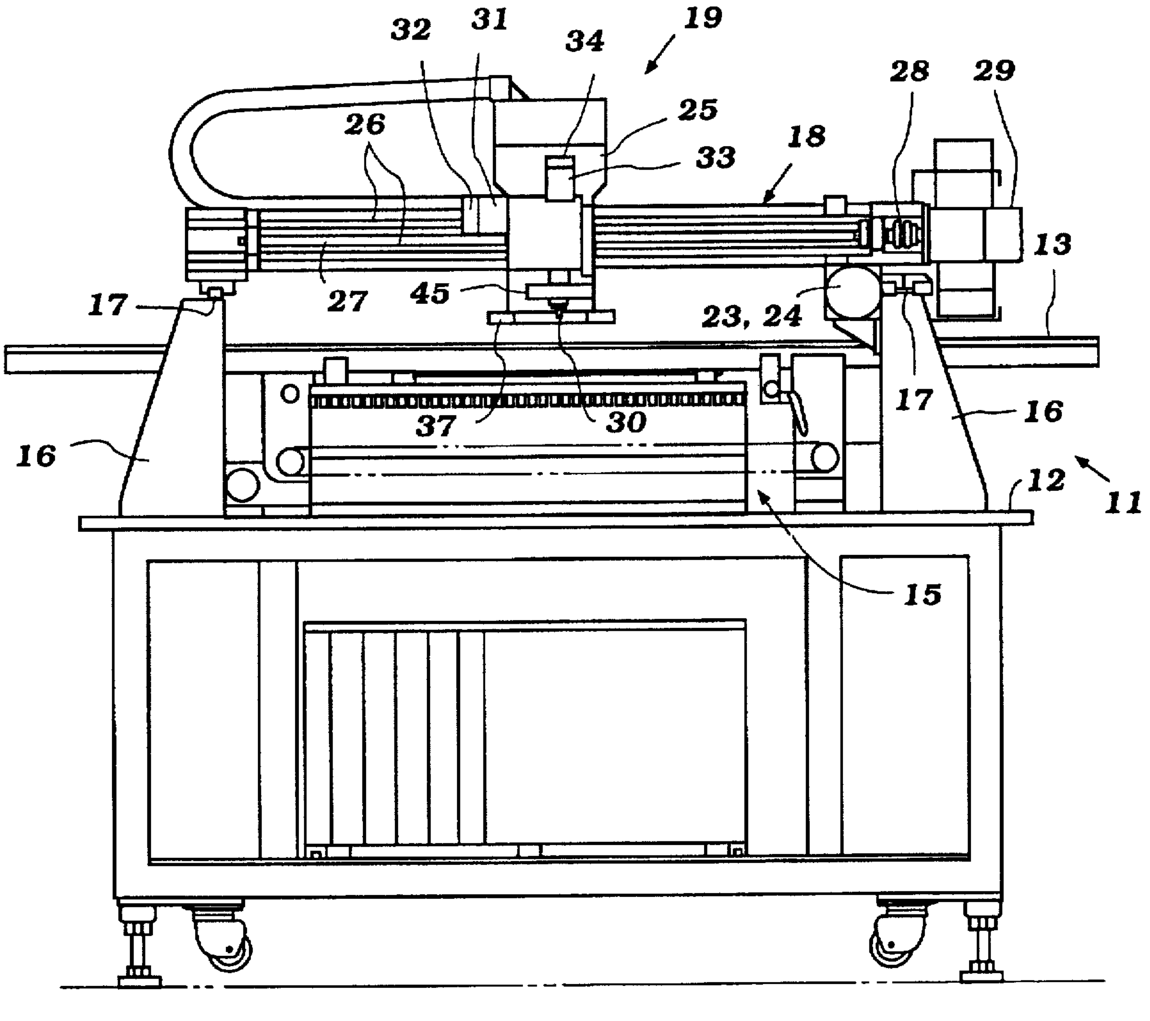
FIG. 2 is a front elevational view of the component mounting apparatus.

Referring now in detail to the drawings, and initially primarily to FIGS. 1 and 2, a component mounting apparatus constructed in accordance with an embodiment of the invention is identified generally by the reference numeral 11. The component mounting apparatus 11 is comprised of a base or table 12 that is mounted and disposed so as to be positioned below a conveyor section 13. The conveyor section 13 operates to transport components or substrates, such as printed circuit boards, indicated by the reference character S, and shown in phantom in FIG. 1, to a mounting area over the table 12.

Disposed on opposite sides of the conveyor 13 are feeder stations 14, each of which comprises a plurality of individual tape feeders 15, which present components to the mounting apparatus 11, for pick-up in a manner as will now be described.

Mounted on the table 12 are a pair of raised pedestals 16 which support a pair of tracks 17 that extend in the Y—Y axis direction. A carriage assembly, indicated generally by the reference numeral 18, is mounted on the tracks 17 for movement in the Y—Y axis direction. A mounting head, indicated generally by the reference numeral 19, is mounted in a manner to be described for movement in an X—X axis direction relative to the carriage 18 and with the carriage for movement in the Y—Y axis direction.

The carriage 18 is affixed to a recirculating ball nut 21 that is engaged with a feed screw 22 that is journaled for rotation along one of the posts 16 at one side of the mounting apparatus 11. The feed screw 22 is, in turn, driven by a Y—Y axis servomotor 23. An encoder 24 is coupled to the output shaft of the Y—Y axis servomotor 23 and provides the signal which indicates the rotational position of the feed screw 22 and, accordingly, the position of the carriage 18 in the Y—Y axis direction.

Figure 4:
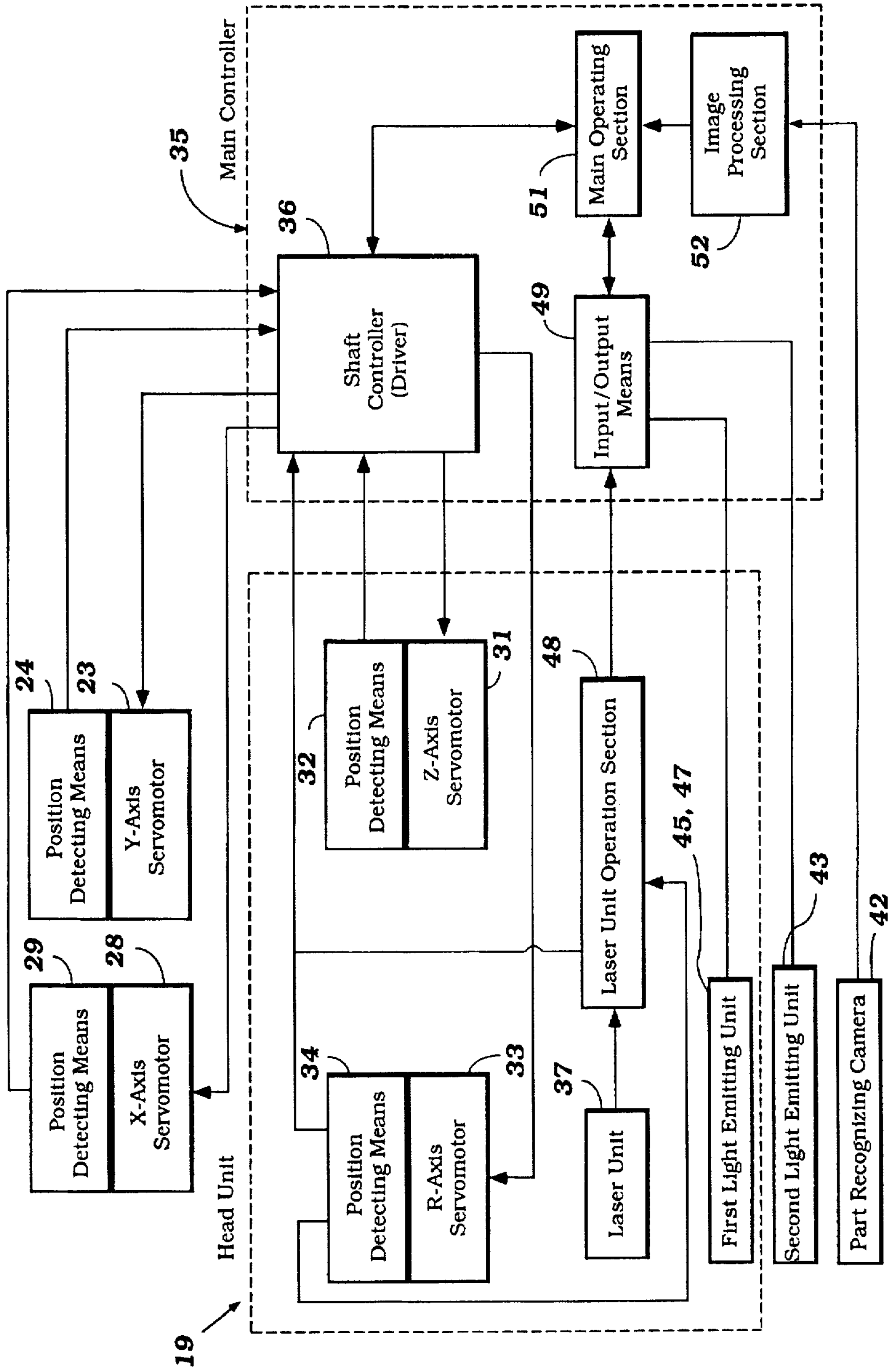
FIG. 4 is a schematic view showing the interrelationship of the various components of the system.

The various Servomotors and their detectors are also shown schematically in FIG. 4, and this figure should also be considered when reading the explanation of FIGS. 1 and 2. FIG. 4 shows how these various components of the system are interrelated to each other, and how their signals and controls are interrelated.

The mounting head 19 has a base portion 25 which is mounted on guide rails 26 that extend in the X—X axis direction along one side of the carriage 18. A nut, such as a recirculating ball nut (not shown), is carried by the mounter base 25 and is engaged with a X—X axis feed screw 27 that is journaled on the carriage 18 between the guide rails 26.

The X—X axis feed screw 27 is driven by a servomotor 28 mounted on the carriage 18 at one end thereof. An encoder 29 is coupled to the output shaft of the X axis servomotor 28 and provides an indication of the X axis position of the mounter head 19.

The mounter head base 25 carries a pick-up device which includes a pick-up nozzle 30. The pick-up nozzle 30 is adapted to pick up components of a wide variety of types and configurations. The pick-up device 30 may be of the vacuum operated type, as is well known in this art.

The pick-up nozzle 30 is supported for movement relative to the base 25 in a Z—Z axis direction. This movement is accomplished by a Z axis servomotor 31 that is coupled to the pick-up nozzle 30 so as to move the pick-up nozzle 30 in the Z axis direction. A feed screw type of mechanism may also be employed for this operation. An encoder 32 is coupled to the output shaft of the Z axis servomotor 31 so as to provide an indication of the Z axis position of the pick-up nozzle 30 and, accordingly, any component carried by it.

Thus, it should be apparent to those skilled in the art that a component which has been picked up by the pick-up nozzle 30 may be moved in the X, Y and Z axis directions by operation of the servomotors 28, 23 and 31, respectively. In addition to these movements, the pick-up nozzle 30 is supported relative to the pick-up head base 28 for rotation in a rotational direction about an R axis.

To this end, there is provided an R axis servomotor 33 that drives the pick-up nozzle 30 so as to rotate it about the R axis. This R axis is also coincident with the Z axis, as should be readily apparent. An encoder 34 is coupled to the output shaft of the R axis servomotor 33 and provides a signal indicative of the R axis position of the pick-up nozzle 30 and a component carried by it.

Referring now to FIG. 4, these servomotors and their detectors are, as has been noted, shown schematically along with their relationship to the control components of this system. These control components include a main controller, indicated by the reference numeral 35, which exchanges information with the encoders 29, 24, 32 and 34, and also drives the X, Y, Z and R axis servomotors 28, 23, 31 and 33 through a shaft controller driver section 36. Those skilled in the art will readily understand how these controls can be effected.

The apparatus as thus far described is thus capable of moving the pick-up nozzle 30 to a selected feeder tape 15 for picking up a selected type of component by operating the X, Y and Z axis servomotors 28, 23 and 31. Because the feeder stations 15 are disposed on opposite sides of the conveyor 13 a large number of components may be handled with small movements of the pick up head 19.

The head 19 is moved to the appropriate pick up feeder with the pick-up nozzle 30 in an elevated position. The pick-up nozzle 30 is then lowered by operating the Z axis servomotor 31 until the component is attracted and the pickup nozzle 30 is then elevated so that the mounting head can move to a new position. When in the desired mounting position, the component is lowered and placed, in a manner as should be readily apparent to those skilled in the art.

As aforenoted, the pick-up device, and particularly the mounting head 19, is capable of being positioned very accurately. However, the picked up components will not be so accurately positioned when picked up and, therefore, it is necessary to sense or determine the orientation of the component as it is picked up so that it can be accurately positioned.

To this end, there are provided a pair of sensing devices, one of which is indicated generally by the reference numeral 37, and is actually carried by the mounting head 19. This sensing device 37 is carried by the base 25, and thus is in a fixed position while the pick-up nozzle 30 is capable of rotating about the R axis and moving axially along the Z axis relative to the sensing device 37. The significance of this will become apparent.

The sensing device 37 is of the optical recognition type and includes a light source 38 which emits parallel light rays across a gap in which the pick-up nozzle 30 is positioned, and which gap comprises a sensing area or sensing station. The light rays will be received by a receptor 39, which may be a CCD type of device, and thus will see the shadow of a component that is positioned in this sensing station. The light source 38 may comprise a laser light source that emits parallel light rays.

This, coupled with the CCD device 39, comprises what is characterized as a laser optical sensing unit which, as has been noted, is identified by the reference numeral 37. Its interrelationship to the other components of the system is shown in FIG. 4.

This optical detector 37 operates in accordance with a recognition method, preferably of the type disclosed in U.S. Pat. No. 5,384,956, issued Jan. 31, 1995, entitled "Method For Mounting Components," and assigned to the assignee hereof, the disclosure of which is incorporated herein by reference. This patent also discloses in more detail how the various X, Y, Z and R axes servomotors 28, 23, 31 and 33 are operated so as to provide the recognition method. Because of the incorporation of this earlier disclosure by reference, a further description of it is not believed to be necessary.

In addition to this type of sensing method and apparatus, other types of sensors can be employed for providing optical or other forms of recognition in the station 37. Generally, these recognition methods are employed to sense the condition of the object by sensing it in a direction perpendicular to its lower face, which face will be mounted on the substrate S.

As has been noted, the type of sensing employed in the station 37 is particularly adapted for use with small components. This type of sensing station does not lend itself necessarily to the sensing of large components and small components, because a sensing station large enough to accurately sense large components will be too large to provide accurate sensing of smaller components.

Figure 3:
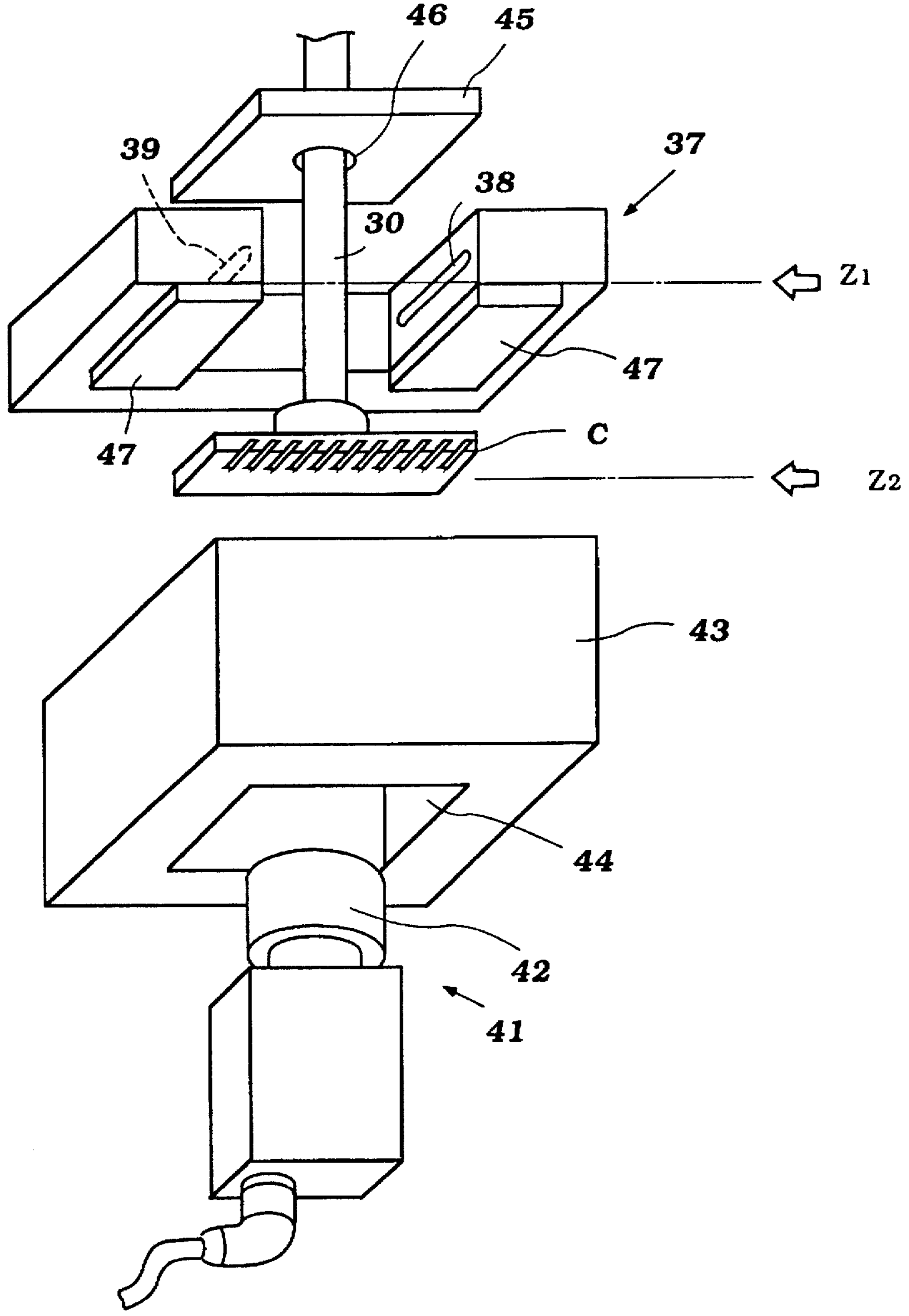
FIG. 3 is an enlarged perspective view showing the two sensing stations, the pick-up device and a component positioned for recognition in one of the sensing stations.

Therefore, and in accordance with the invention, a further sensing station is provided, and this is, in the illustrated embodiment, indicated by the reference numeral 41. The sensing station 41 includes a sensing device in the form of an electronic camera 42 that is mounted at a fixed position on the table 12 on one side of the conveyor 13. This optical camera can be, for example, a CCD camera which is constructed so as to view the image of the part in two dimensions and, thus, recognizes the component such as a component indicated by the reference character C in FIG. 3 which component is larger than the gap between the emitter 38 and receptor 39 of the first sensing station 37. The CCD camera 42 requires a light source that is capable of transmitting light onto the component C.

In one recognition method, the component C itself is illuminated and, for this purpose, a first light source, indicated by the reference numeral 43, is provided which has a generally rectangular configuration and which defines an opening 44 in the line of path to the camera 42. Light from the light source 43 will be reflected from the component C back to the camera 42 through the opening 44 so that the component C can be recognized. Since the component C is sensed in a fixed position relative to the pickup nozzle 30, its actual orientation and the corrective factors can be determined in a single reading.

With some types of components C, the condition is such that reflective light sensing by the camera 42 is not desirable or possible. In this case, the camera 42 may be employed so as to receive the shadow cast by the component C so as to detect its orientation. In order to accomplish this, there is provided a first light source 45 that is carried in a fixed condition by the mounting head base 25 and which has an opening 46 that is sized so that the pickup nozzle 30 may pass through it. The light source 45 casts light through the gap between the emitter 38 and the receptor 39 of the optical recognition section 37.

However, the component C may be actually wider than this gap and, thus, supplemental light sources 47 may be carried by the undersides of the emitter and receptor sections 38 and 39, respectively. Thus, the component C can be sensed by the camera 42 when it is larger than practical to sense in the optical detecting section 37.

Since the camera 42 is provided in a fixed position on the table 12, it is necessary to move the mounting head 19 to this fixed position for sensing before the component can be positioned.

Referring now primarily to FIG. 4, the remaining components of the main controller 35 and the sensing devices will be described. The output from the laser sensor 37 is directed to a laser unit operational section, indicated schematically at 48 and which may be carried by the mounting head 19. This performs calculations in the manner described in the aforenoted patent and transmits the results to an input/output means 49 of the main controller 35 which interchanges information with the main operational section 51.

In a like manner, the input/output means 49 selects which of the light sources 45 and 47 or 43 are employed for the recognition by the camera 42. The output from the camera 42 is provided to an image processing section 52 of the main controller 35. Thus, the main operational section 51 receives the information from either the input/output means 49 and/or the image processing section 52 so as to make the necessary determinations of the corrections which should be made when the component is mounted.

Figure 5:
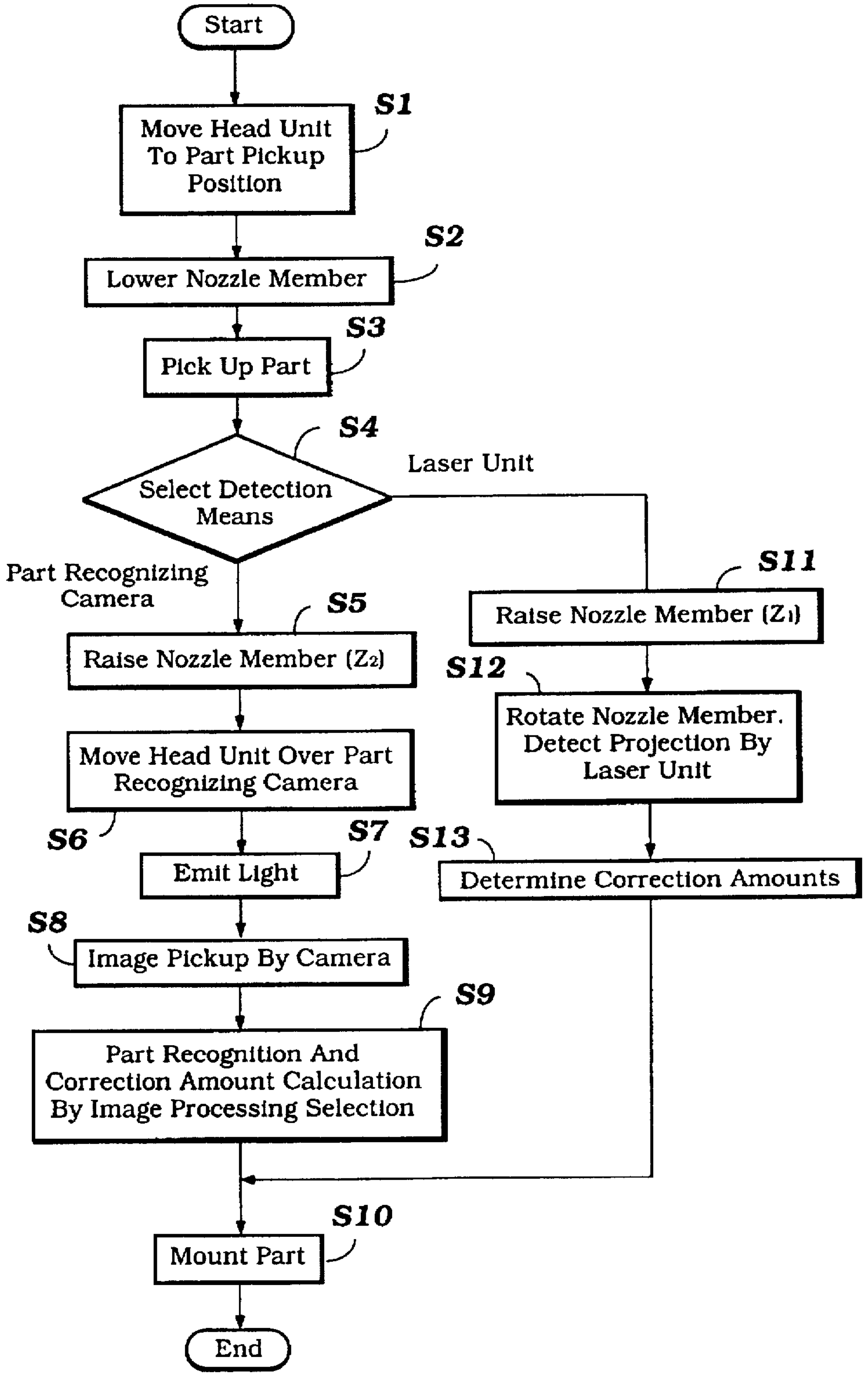
FIG. 5 is a block diagram showing the control routine whereby the component recognition method is selected, the correction necessary generated, and the component is mounted.

The actual mounting routine will now be described by particular reference to FIG. 5. The program starts and then moves to the step S1 wherein the main controller 35 including its main operation section 51 begins to operate the X axis servomotor 28 and Y axis servomotor 23 to a pickup position at one of the feeders 15 so as to pickup a selected part in accordance with its program.

At this time, the pickup nozzle 30 will have been elevated to a fully retracted position where it lies either at a position aligned with the light source 45 or even above it. The movement continues until the mounting head 19 is disposed above the respective feeder 15 that contains the component to be picked up.

Once this station is reached, the Z axis servomotor 31 is energized to lower it so as to bring the pickup nozzle 30 at the appropriate height to pick up the components. When it reaches this height and at the step $3, the vacuum source is energized and the part is picked up and attracted to the pickup nozzle 30 in the manner known in this art.

The program then moves to the step $4 so as to detect which of the recognition methods will be employed. Assuming that the component C to be picked up that is one that is too large to fit in the first sensing station 37 that of the laser unit, the camera recognition station 41 is selected for use and the program at the step S5 raises the pick up nozzle 37 and component C to a height $Z_2$ and shown in FIG. 3, which height is below the first detecting station 37. Again, this achieved by actuating the Z axis servomotor 31.

The program then at the step S6 effects movement of the entire mounting head 19 toward the second sensing station 41. Again, this is done by actuating the X and Y axis servomotors 28 and 23. This motion continues until the pickup nozzle 30 is disposed above the camera The program then determines at the step S7 which of the recognition methods employed by the camera 42 will be utilized. That is, whether the reflective recognition process will be achieved or the shadow method will be achieved. Depending upon which method is utilized, either the light source 43 or the light sources 45 and 47 will be energized.

The camera 42 then receives the image at the step S8. The program then moves to the step S9 wherein the image processing section 52 provides the calculation necessary form the image to determine the X, Y and R axis offsets of the component C.

At the step S10, the main operating section 51 operates the shaft controller or driver 36 so as to energize the X axis servomotor 28, the Y axis servomotor 30 and the R axis servomotor 33 so as to position the component C in the corrected position so that it will be disposed at the right orientation above the substrate S. At this time, the X axis servomotor 31 will be energized to lower the pickup nozzle 30 and, when at the right height, the vacuum is turned off and the component will be deposited. The pickup nozzle 30 is then retracted for the next operation.

If, however, at the step S4, it is determined that the laser optical sensing station 37 should be utilized, then at the step S11 the pickup nozzle 30 is elevated so as to place the component C at the Z axis location $Z_1$.

When at the step S12 the pickup nozzle 30 is rotated so as to perform a recognition method, for example, that described in aforenoted U.S. Pat. No. 5,384,956. From this process it is then possible at the step S13 to determine the corrective amounts in the placement. Once this has been calculated by the laser operation section 48, the input/output 49 and the main operation section 51, the pickup nozzle 30 is moved to the mounting position and mounting is achieved in the same manner as previously described at the step S10.

In the described operation, the mounting head 19 had been described as carrying only a single pickup nozzle 30. It should be readily apparent, however, from those skilled in the art that the system may be employed with an arrangement wherein plural pickup nozzles are employed. Also, it should be understood that the foregoing description is only that of a preferred embodiment of the invention and various changes and modifications may be made without departing from the spirit and scope of the invention, as defined by the appended claims.

What is claimed is:

1. A component handling device for accurately placing components on a substrate comprising a mounting head, an operational device connected to said mounting head for moving said mounting head between a plurality of positions, a first sensing station carded by said mounting head and comprised of an emitter and a receptor spaced by a gap for forming a sensing area, a second sensing station, spaced from said first sensing station, said second sensing station containing a second sensing device comprised of a camera held in a fixed position for sensing the condition of a component, a component pickup device for holding and releasing components, a support for supporting said pickup device for movement within said mounting head upon operation of said operational device and for movement relative to said mounting head for selectively positioning the component held by said pickup device in a first position in said sensing area for sensing of its condition by said first sensing device therein or in a second position spaced from said sensing area for sensing by said second sensing device in said second sensing station, and a light source carded by said mounting head in proximity to said first sensing station for illuminating said component held by said component pickup device at least when said component is positioned in said second position for facilitating sensing with said camera.

2. The component handling device as set forth in claim 1, wherein the pickup device is movable in a Z axis direction relative to the mounting head and the operational device is operative to move the mounting head in the X and Y axis directions.

3. The component handling device as set forth in claim 2, wherein the first sensing station is disposed vertically above the second sensing station so that the first position of the pickup device is vertically above the second position of the pickup device.

4. The component handling device as set forth in claim 3, wherein the second sensing device is fixed and the mounting head is moved by the operational device to registry therewith for sensing by the second sensing device.

5. The component handling device as set forth in claim 2, wherein the pickup device is supported for rotation about an R axis relative to the mounting head.

6. The component handling device as set forth in claim 5, wherein the first sensing station is fixed against rotation relative to the mounting head and the sensing of the condition of the component is accomplished at least in part by rotation of the component in the sensing area.

7. The component handling device as set forth in claim 6, wherein the emitter comprises a light source and the receptor comprises a CCD device.

8. The component handling device as set forth in claim 7, wherein the camera comprises an optical camera held in a fixed position.

9. The component handling device as set forth in claim 8, wherein the light source carded by the mounting head lights the component and casts a shadow on the camera.

10. The component handling device as set forth in claim 9, further including a further light source fixed relative to the optical camera for use in providing a reflective recognition of the component.

11. The component handling device as set forth in claim 1, wherein the light source comprises a planar light source having an opening through which at least a portion of the pickup device extends when the pickup device is holding a component.

12. The component handling device as set forth in claim 1, wherein the light source is mounted upon the first sensing station.

* * * * *

UNITED STATES PATENT AND TRADEMARK OFFICE

CERTIFICATE OF CORRECTION

PATENT NO. : 5,724,722
DATED : March 10, 1998
INVENTOR(S) : Hashimoto

It is certified that error appears in the above-identified patent and that said Letters Patent is hereby corrected as shown below:

Column 7,
Line 40, please change “station carded” to -- station carried --.

Signed and Sealed this

Twelfth Day of November, 2002

Attest:

JAMES E. ROGAN
*Director of the United States Patent and Trademark Office*

*Attesting Officer*